(12) United States Patent
Cooke

(10) Patent No.: US 7,412,636 B2
(45) Date of Patent: Aug. 12, 2008

(54) SCAN STRING SEGMENTATION FOR DIGITAL TEST COMPRESSION

(75) Inventor: Laurence H. Cooke, Los Gatos, CA (US)

(73) Assignee: OC Applications Research LLC, Wilmington, DE (US)

( * ) Notice: Subject to any disclaimer, the term of this patent is extended or adjusted under 35 U.S.C. 154(b) by 311 days.

(21) Appl. No.: 11/208,883

(22) Filed: Aug. 23, 2005

(65) Prior Publication Data

US 2007/0168798 A1    Jul. 19, 2007

(51) Int. Cl.
*G01R 31/28*    (2006.01)

(52) U.S. Cl. ..................................... 714/726

(58) Field of Classification Search .................. 714/726
See application file for complete search history.

(56) References Cited

U.S. PATENT DOCUMENTS 6,378,108 B1 *   4/2002   Schoellkopf ................. 714/800
2005/0216805 A1 *   9/2005   Guettaf ....................... 714/726

* cited by examiner

*Primary Examiner*—James C Kerveros
(74) *Attorney, Agent, or Firm*—Connolly Bove Lodge & Hutz LLP

(57) ABSTRACT

One may use a new technique to determine the placement of exclusive-ors in each scan string of a chip may achieve improved test vector compression, and one may combine this technique with methods to minimize the overhead of the exclusive-or logic, to eliminate clock enable logic for multiple scan strings, to minimize the changes to existing test logic insertion and scan strings reordering, and to minimize the test vector compression computation time.

8 Claims, 5 Drawing Sheets

US 7,412,636 B2

SCAN STRING SEGMENTATION FOR DIGITAL TEST COMPRESSION

FIELD OF THE INVENTION

The present invention is related to improvements in digital logic testing, particularly improvements to scan based digital logic testing, which uses check-sum or signature register logic and exclusive-or operations on serial shift string logic. Specifically improvements to the segmentation of serial shift string logic to reduce test data volume and minimize test time.

BACKGROUND AND SUMMARY OF THE INVENTION

Prior co-pending U.S. patent application Ser. No. 10/351,276, filed on Jan. 24, 2003, published as U.S. Published Patent Application No. 20030229834, and U.S. patent application Ser. No. 10/750,949, filed on Jan. 5, 2004, published as U.S. Published Patent Application No. 20040148554, have demonstrated techniques to reduce digital test time and test pattern volume, by periodically inserting two-input exclusive-or gates (XOR) between selected pairs of flip-flops in the scan strings, connecting one input of each XOR to the prior flip-flop in the scan string and the other input of each XOR to the data input of the scan string and periodically connecting a flip-flop output of the scan string to a signature register such that the serial shift register scan in and scan out data may be compressed. The prior art describes the need for proper placement of these XOR and tap functions. The present disclosure improves on the work done in the prior art by disclosing a technique whereby more optimal placement of these XOR functions may be determined. The disclosure also presents a modified flip-flop structure, which can serve as both the inserted XOR function or a portion of the signature register.

As shown in FIG. 1, the prior art teaches the conversion of a traditional scan string, comprised of flip-flops 13, which are serially connected in order to be able to shift in test data through the scan string input 14, and shift out test results from the output 15 when testing a digital integrated circuit. The conversion consists of inserting XOR gates 12 periodically throughout the scan string, and periodically tapping off the output of a flip-flop into a checksum function, which is comprised of XOR functions 10 and a Multiple Input Shift Register (MISR) 11, whose output 15 provides a signature of the collected data. In this manner the prior state of the scan string is exclusive-ored with the input data at various points across the scan string to create a pattern with specific values on a subset of the flip-flops, called care-in locations, that are needed to test for specific faulty conditions. In the same fashion, the output results, which are collected from specific points on the scan string, called care-out locations, may be captured to detect the faulty conditions. This technique allows the vast majority of Automatic Test Pattern Generated (ATPG) tests to be performed on the integrated circuit with much less data and in far less shift clock cycles than traditional scan methods. The prior art also presents methods to determine the number of shift cycles and the corresponding input values of these compressed patterns by simulating with variables for the input values, generating a series of equations each consisting of the exclusive-or of the previous captured state in the scan string with one or more input variables and solving the resulting equations that reside on all of the care-in locations, while determining that sufficient shift cycles have been used to also capture the values on all the care-out locations from the previous pattern.

The current disclosure presents a simple algorithm to ensure that after N cycles shifting into a scan string that contains up to $2^N$ flip-flops, no two flip-flops contain the same equation of input variables, thus optimizing the likelihood of finding a solution to the set of equations at the care-in locations in the fewest number of shifts.

Unfortunately, this solution requires at least half as many XOR functions as there are flip-flops in the scan string to obtain the improved segmentation of the scan-string, so the disclosure also presents a flip-flop with a built-in XOR function and a simple method for converting traditional scan strings into more optimally segmented and tapped scan strings.

BRIEF DESCRIPTION OF THE DRAWINGS

Embodiments of the invention will now be described in conjunction with the attached drawings, in which:

FIG. 3b are logical diagrams of the structure in FIG. 3a,

DESCRIPTION OF SPECIFIC EMBODIMENTS

Figure 1:
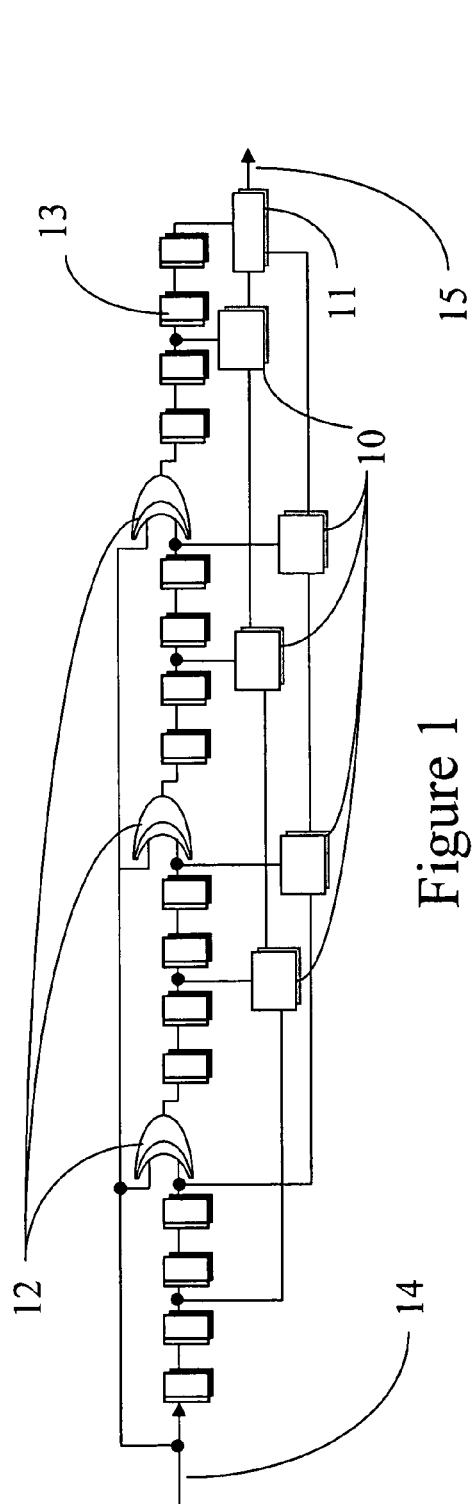
FIG. 1 is prior art diagram of a segmented scan string.

In a preferred embodiment of the present invention, an improved placement of the exclusive-or gates in a scan string resulting in improved segmentation and compression may be defined by utilizing a simple algorithm that orders $2^N$ numbers by successively doubling the prior number and optionally incrementing the result.

Some background and initial observations will lead to determining what the improved segmentation of a scan string should be. Given a symbolic simulation, which generates equations that are the exclusive-or of the previous state of the scan string and one or more input variables as they are combined over multiple clock cycles, by propagating through the XOR gates inserted into the scan string, it is fairly obvious that for any given number of input variables scanned into the chain there are three possible outcomes for each variable:

1) the variable is not needed to satisfy any care-in value,
2) the variable is needed to satisfy one care-in value, or
3) the variable is needed to satisfy two or more care-in values.

In the first two cases the required care-in values are covered by the inputted variables, and in the last case each variable covers only one of the required values. If N shifts were made, and K of the variables shifted in do not cover any care-in locations, then we could only guarantee a solution for N–K care-in locations that are covered by variables, assuming that there are not multiple variables covering the same care-in locations. For example, if two variables, say, a and b, were both covering two care-in locations, and no other variables covered these two care-in locations, then the probability that a solution can be found is ½ because the two variables guarantee either a 1 or a 0 can be set on both care-in locations, but it must be the same value, if the previous state was the same. It should also be pointed out that the probability (given random generation of care-in values) that the two care-in locations need to be set to the same value is ½.

Now this suggests that the improved segmentation would be to guarantee that N shifts produce all possible combinations of N variables, one combination in each of the locations of the string. Such a configuration would eliminate the possibility of the identical set of variables in two or more care-in locations. Conveniently, there are $2^N$ such subsets of a set containing N elements, which means the proper segmentation would be such that a string of $2^N-1$ locations could have all the non-null subsets of N variables available (without repetition), one subset on each of the $2^N-1$ locations. Then we can guarantee that N care-in locations could be covered with the proper values in N shifts, regardless of where the N care-in locations are.

Some trivial cases for N=2,3 and 4 are shown in Table 1 below:

TABLE 1

| 1 | x | a | b |   | 1 | x | a | b | c |   | 1 | x | a | b | c | d |
|---|---|---|----|---|---|---|---|----|----|---|---|---|---|----|-----|------|
| 2 | x | a | ab |   | 2 | x | a | ab | bc |   | 2 | x | a | ab | bc  | cd   |
| 3 |   |   | a  |   | 3 | x | a | ab | abc|   | 3 | x | a | ab | abc | bcd  |
|   |   |   |    |   | 4 |   |   | a  | ab |   | 4 | x | a | ab | abc | abcd |
|   |   |   |    |   | 5 | x | a | b  | ac |   | 5 |   |   | a  | ab  | abc  |
|   |   |   |    |   | 6 |   |   | a  | b  |   | 6 | x | a | b  | ac  | abd  |
|   |   |   |    |   | 7 |   |   |    | a  |   | 7 | x | a | ab | bc  | acd  |
|   |   |   |    |   |   |   |   |    |    |   | 8 |   |   | a  | ab  | bc   |
|   |   |   |    |   |   |   |   |    |    |   | 9 |   |   |    | a   | ab   |
|   |   |   |    |   |   |   |   |    |    |   | 10| x | a | b  | c   | ad   |
|   |   |   |    |   |   |   |   |    |    |   | 11|   |   | a  | b   | c    |
|   |   |   |    |   |   |   |   |    |    |   | 12| x | a | b  | ac  | bd   |
|   |   |   |    |   |   |   |   |    |    |   | 13|   |   | a  | b   | ac   |
|   |   |   |    |   |   |   |   |    |    |   | 14|   |   |    | a   | b    |
|   |   |   |    |   |   |   |   |    |    |   | 15|   |   |    |     | a    |

Here, the string locations are the numbers listed down the first column for each of the three examples. The Xs in the second columns mark the spots (before the flip-flops) where exclusive-ors are placed. The next N columns to the right of the gray columns show the resulting input variables after 1, 2 ... to N shifts, where variables a,b,c and d were shifted into the scan string on each successive shift. The last column to the right in each of the three examples shows that all subsets of the set of N variables exist, a unique combination of variables in each location of each string. The actual function is the exclusive-or of each of the listed variables without the previous state since it is not a variable. Of course, this process continues through all $2^N-1$ shifts, where $2^N-1$ variables exist in unique combinations across the whole scan string. For example, the first case in Table 1 above, where N=2, the next shift puts c in location 1, bc in location 2, and ab in location 3, from which any combination of values can be specified by different values.

Figure 2:
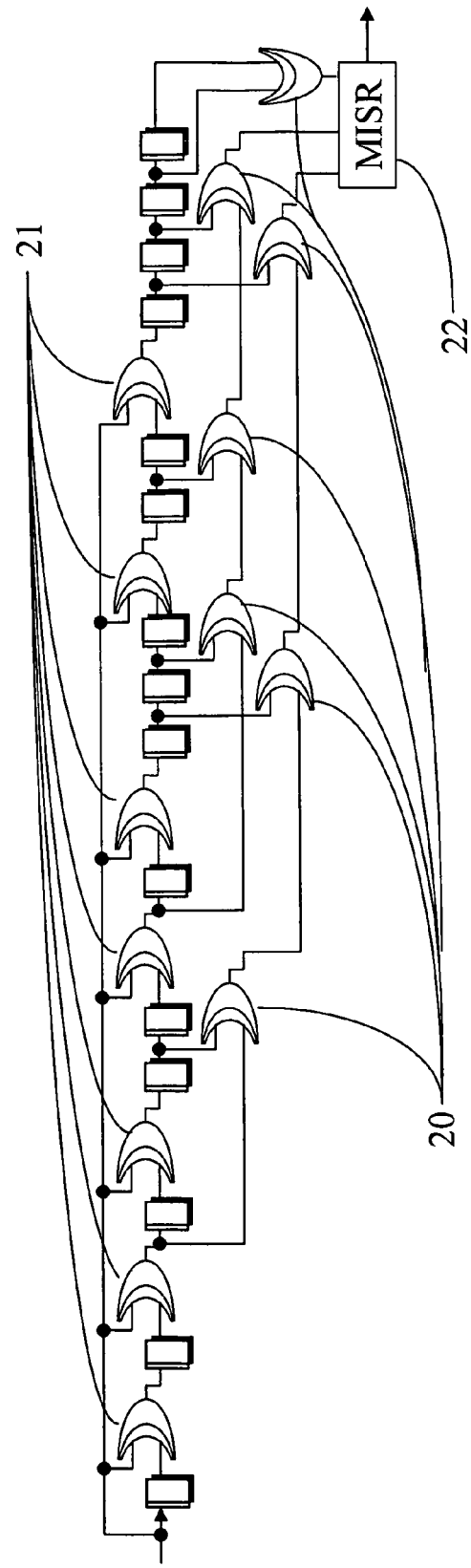
FIG. 2 is a diagram of a segmented scan string as defined in Table 1.

FIG. 2 is a logic diagram of the N=4, 15 bit case where each flip-flop of the scan string, except the last, has an XOR function attached to its output. Half of the XOR gates 20 are used to propagate tap points, and the other half 21 are used as segment breaks.

Now, in order to create segmentation for a scan string of any size it is necessary to generate the exclusive-or locations for any size scan string, which may be done by using the algorithm below to properly sort all N-bit binary numbers:

set M=0;
Do I=1 to $2^{N-1}$;
   if 2*M+1 has not been set yet, then set $M=2*M+1$; otherwise set $M=2*M$;
   if $M>2^N$ then set $M=M-2^N$;
end Do;

This results in the exclusive-or locations (x locations) being defined by the points where 1 is added to 2*M, as can be seen in the examples for N=2,3 and 4 in Table 2 below:

TABLE 2

| 0 | C | 0 | 0 | C | 0 | 0  | C | 0  |
|---|---|---|---|---|---|----|---|----|
| 1 | x | 1 | 1 | x | 1 | 1  | x | 1  |
| 2 | x | 3 | 2 | x | 3 | 2  | x | 3  |
| 3 |   | 2 | 3 | x | 7 | 3  | x | 7  |
|   |   |   | 4 |   | 6 | 4  | x | 15 |
|   |   |   | 5 | x | 5 | 5  |   | 14 |
|   |   |   | 6 |   | 2 | 6  | x | 13 |
|   |   |   | 7 |   | 4 | 7  | x | 11 |
|   |   |   |   |   |   | 8  |   | 6  |
|   |   |   |   |   |   | 9  |   | 12 |
|   |   |   |   |   |   | 10 | x | 9  |
|   |   |   |   |   |   | 11 |   | 2  |
|   |   |   |   |   |   | 12 | x | 5  |
|   |   |   |   |   |   | 13 |   | 10 |
|   |   |   |   |   |   | 14 |   | 4  |
|   |   |   |   |   |   | 15 |   | 8  |
|   |   |   |   |   |   | 16 |   | 0  |

The locations where a 1 is added to 2*M numbers are marked with an x in the carry column (C). Of course, the first example contains numbers from 1 to 3, the second numbers from 1 to 7 and the third numbers from 1 to 15, where each bit in the binary representation corresponds to one of the N variables in the previous examples. What is important to note is that the entire set of $2^N$ numbers is listed without repetition.

Now this segmentation results in two empirical observations:

1) M shifts will guarantee M care-in locations, regardless of their values, can be set, providing M>N where the string size is less than $2^N$, and 2) It is possible to set M care-in locations, in M-K locations, with a probability of $1/[2^K]$.

This second observation comes from the fact that there are M-K variables covering M care-in locations, so on average K locations must have the proper state to match the required care-ins, but each location's probability of being in the proper state is ½. This means that if the state of the string was evaluated for each shift, the probability of matching the M care-in states is $1/2^M$ without shifting and $1/2^{M-k}$ for each shift thereafter, to a probability of $1/2^0=1$, when k=M. If each shift is performed and M>N, then the probability that a solution will be found after M-1 shifts is equal to $$\sum_{x=0}^{M} \frac{1}{2^x},$$

which is approximately 1 for M>9.

As a result, in another preferred embodiment of the present invention, when compressing test data for more optimally segmented scan strings, only M-K to M shift locations, where M is the number of required care-in locations, need be checked. This can be accomplished by either an evaluator, until a shift state is found that has a high probability of being good, or a compression algorithm that can be set up to process any given shift state of the symbolic simulation without processing all the prior shift states. This is true regardless of the size of the string or the size of M. This approach will, on average, result in $1/2^K$ worse results than checking all shift locations. So, if M is large enough (greater than 9), solving for all possible shift positions yields an expected shift count of M−1, approaching M as fewer shift locations are evaluated all the way to just the Mth shift location.

Now this clearly translates into impressive single string compression. Taking an existing scan string of N bits and T patterns, there are 2*N*T shifts (shifting in all bits and shifting out all bits for each pattern). Since taps for the checksum can be set up to guarantee catching all the expected outputs in less than M shifts, only M shifts need to be done on each pattern. So if the average care-in percentage is k, then N*T*k care-ins need to be set, which can be done with this segmentation in less than N*k*T shifts. The worse case compression factor is then 2*N*T/N*k*T=2/k. In other words a test suite with an average of 4% care-ins will be compressed by a factor of at least 50.

Figure 3A:
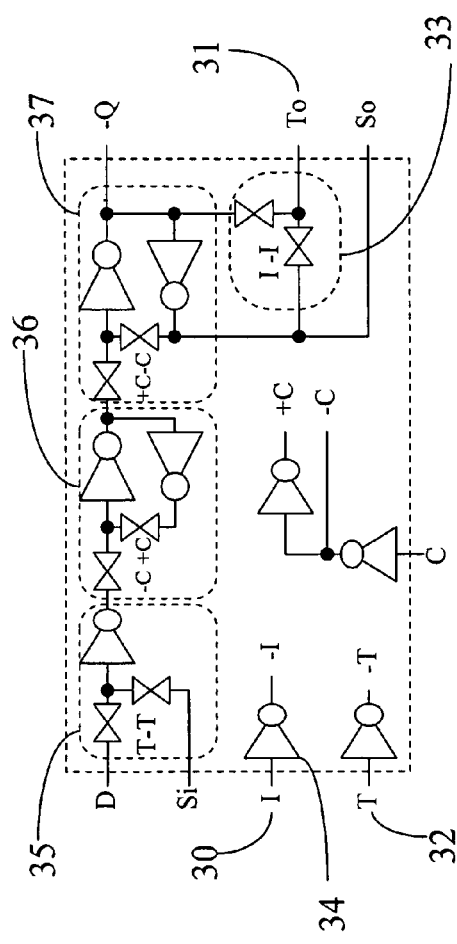
FIG. 3a is detailed diagram of a single flip-flop with built-in exclusive-.
Figure 3B:
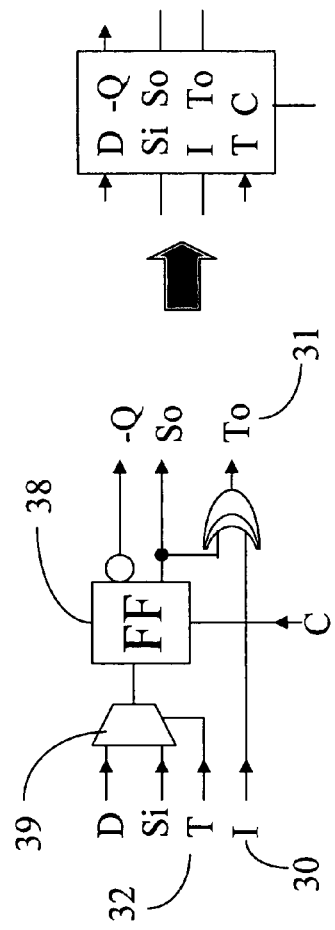

Given ½ of the flip-flops in a scan string must have exclusive-ors behind them to more optimally segment the scan string, an exclusive-or may be built into the scan string with considerable savings of hardware. FIG. 3a is a detailed diagram of such a Variable Scan Flip-Flop, containing a scan flip-flop consisting of a multiplexer 35 driving a master latch 36, which in turn drives a slave latch 37. A normal two-input exclusive-or consists of a two-to-one multiplexer whose output is the output of the exclusive-or, and whose data inputs are driven by the exclusive-or's first input and its complement, and the multiplexer's control is driven by the exclusive-or's second input. This takes at least two to possibly three gates when both phases of the control input are generated, whereas the exclusive-or within the Variable Scan Flip-Flop in FIG. 3a consists of a two-to-one multiplexer 33 and a single inverter 34 to generate both phases of its control inputs, which is only 1½ gates because both phases of the slave latch 37 drive the data inputs of the multiplexer 33. The corresponding logical diagram in FIG. 3b shows the output of the flip-flop 38 is one input to the exclusive-or, the input I 30 is the other input to the exclusive-or, and To 31 is the output from the exclusive-or. The rest of the signals are the same as a traditional scan flip-flop, such as the combination of the multiplexer 39 and flip-flop 38 shown in FIG. 3b, or the corresponding multiplexer 35, master latch 36, and slave latch 37 shown in FIG. 3a, which uses the system clock for shifting when the test mode is applied to the T input 32.

Hence, in a preferred embodiment of the present invention, a Variable Scan Flip-Flop may be constructed by combining an existing scan flip-flop and an inverter with a 2:1 multiplexer, where the 2:1 multiplexer's data inputs are connected to both phases of an existing scan flip-flop's slave and the inverter generates the opposite phase of an external signal, both of which are control inputs to the multiplexer.

In another embodiment of the present invention the compression logic may be added to an existing logical design following scan logic insertion and reordering, by a) exchanging the traditional scan flip-flops for variable scan flip-flops, which are traditional scan flip-flops with built-in exclusive-ors, e.g., as described above, b) for all segment breaks, connecting the I input to the data in input signal, disconnecting the input signal Si to the next flip-flop from the So output and connecting that signal to the To output, c) for all other flip-flops, connecting the I input to a prior To output, and d) connecting the remaining unconnected I input to a user specified prior To or So output, disconnecting the So pin on the last flip-flop from the Data out signal and reconnecting the Data out signal to the To output.

Figure 4A:
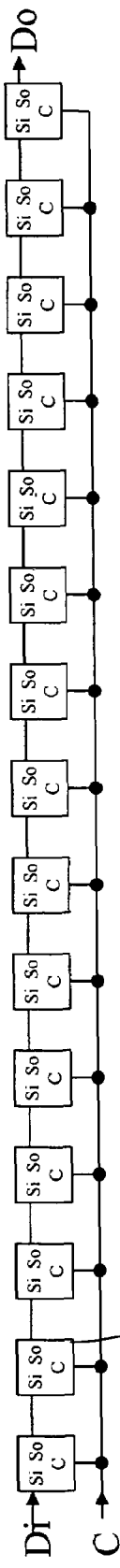
FIG. 4a is a diagram of a scan chain composed of traditional scan flip-flops.
Figure 4B:
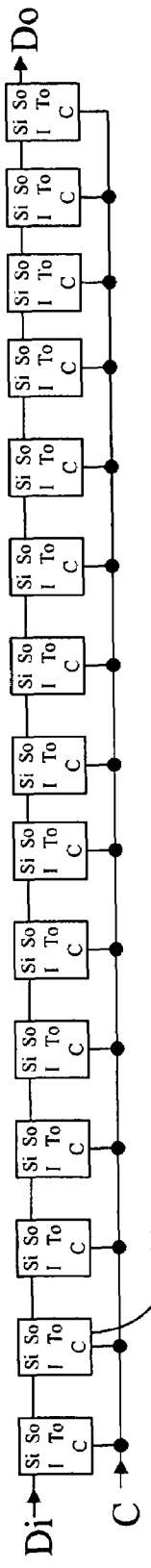
FIG. 4b is the scan chain in FIG. 4a after exchanging the scan flip-flops for variable scan flip-flops.
Figure 4C:
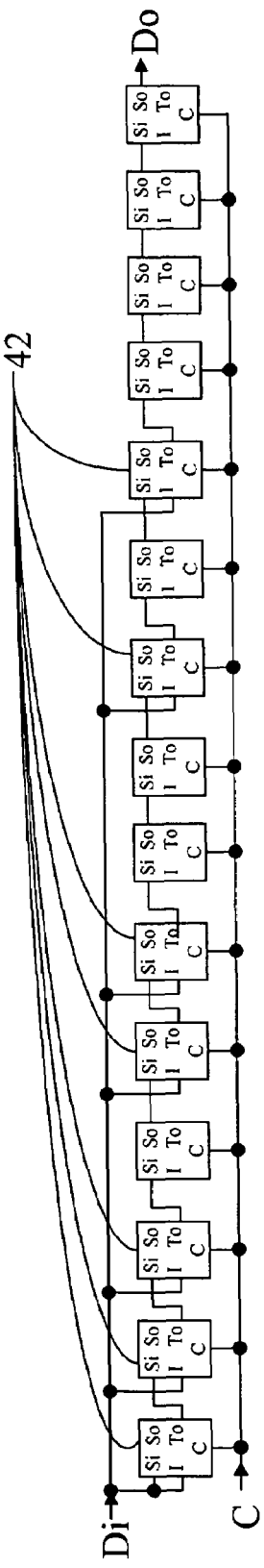
FIG. 4c is the scan chain in FIG. 4b with the segment breaks connected.
Figure 4D:
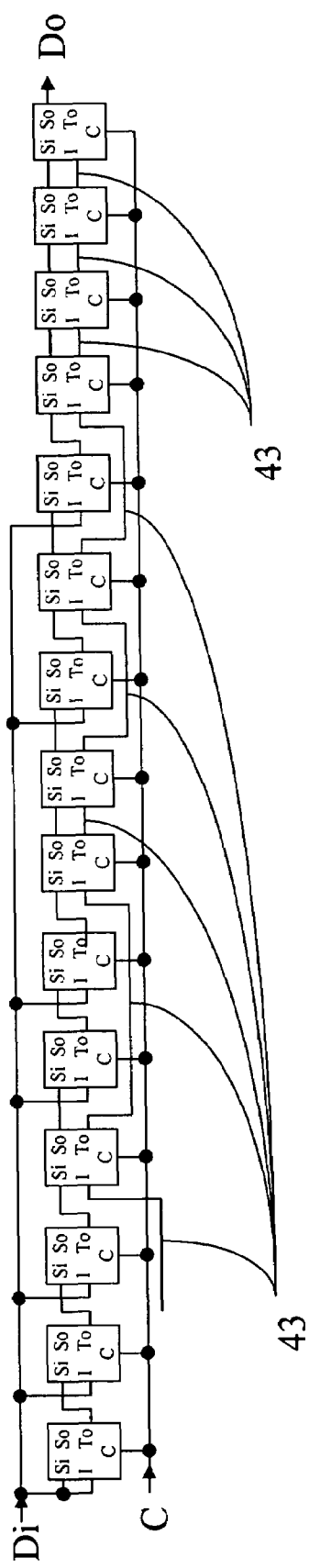
FIG. 4d is the scan chain in FIG. 4c with the tap points connected, FIG. 4e a the fully connected, segmented scan string comprised of flip-flops with built-in exclusive-or functions.
Figure 4E:
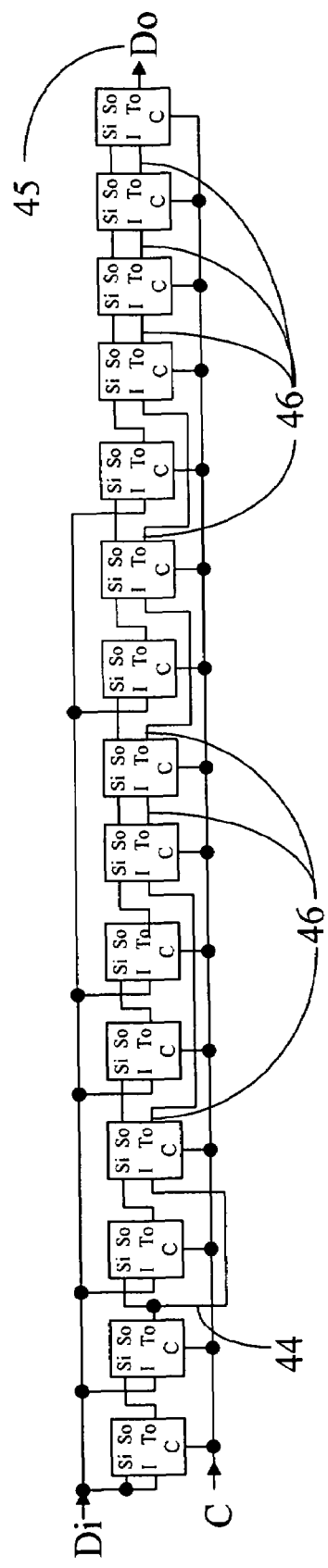

FIGS. 4a through 4e together form a pictorial representation of this process on a 15-bit scan shift register. FIG. 4a is a diagram of a scan chain comprised of traditional scan flip-flops 40 prior to conversion by the process mentioned above. FIG. 4b shows the results of applying step a) on the scan string in FIG. 4a, where the traditional scan flip-flops are replaced with variable scan flip-flops 41. FIG. 4c shows the results of applying step b) above to the scan chain in FIG. 4b. The connections to the variable scan flip-flops 42 are changed to create the segment breaks in locations which correspond to the Xs listed in the N=4 case shown in Tables 1 and 2 above. FIG. 4d shows the addition of the tap connections 43 after applying step c) of the process. Finally, FIG. 4e shows the results of applying step d). The output of the second bit 44 was designated, by the user, as the first tap point, because it bisects the largest group of shift register bits without a tap point. The tap points 44 and 46 are serially exclusive-ored together with the last stage driving the Do 45 signal. While this doesn't show a MISR, such a structure may be added, and if additional tap points are needed, the last bits in the scan string may be organized in a tree structure to allow for more taps, in a manner similar to the tap connections to the exclusive-ors 20 that in turn connect to the MISR 22 shown in FIG. 2.

Figure 5:
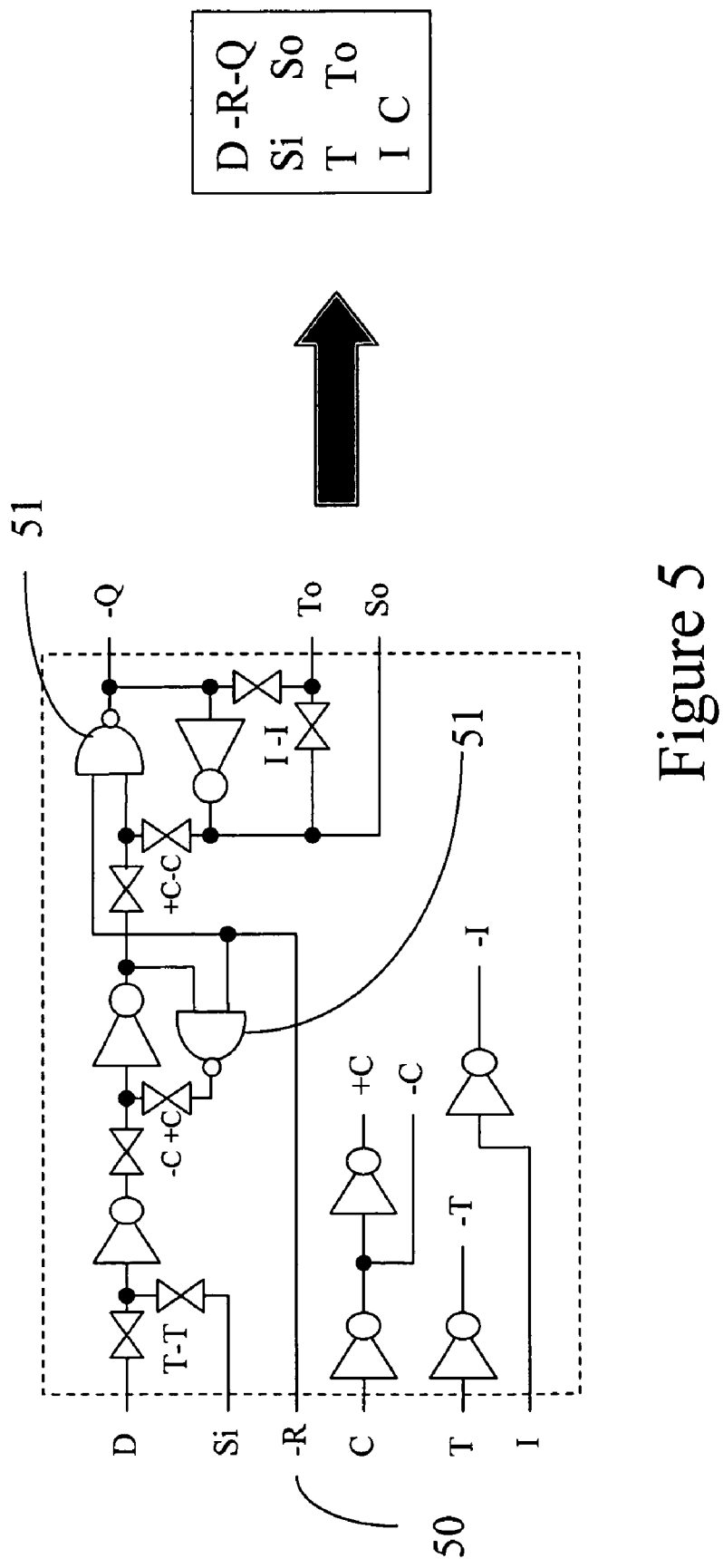
FIG. 5 is a diagram of a flip-flop with reset and a built-in exclusive-or function.

As shown in FIG. 5, if a reset is desired to ensure each of the tests are independent of any previous test's states, an asynchronous reset signal 50 may be added to the scan flip-flop with exclusive-or, by replacing two of the inverters in the Flip-flop with NAND gates 51.

Since the number of shift cycles to compress a test pattern is so predictable, multiple scan strings on a single integrated circuit need not be individually clocked as described in the prior art. Instead, when using a compression algorithm that can independently check any given shift cycle for a solution without having to shift up to that cycle, the following algorithm may be employed to find the number of shift cycles that produces a good result for all the scan strings:

For each test:
  Select the scan string with the largest number of care-in values and compress,
  Set the resulting shift count as the good shift count, and
  Flag all other scan strings as unsolved;
  While unsolved scan strings exist do;
    compress an unsolved scan string starting at the good shift count;
    if the solved shift count <> good shift count then
      set the good shift count to the solved shift count, and
      flag all other scan strings as unsolved
    flag this scan string as solved end while;
end for;

When the improved segmentation is employed the algorithm finds a common shift count for all the scan strings, typically within a few cycles of the good shift count for the scan string with the largest number of care-ins. For patterns such as these, no clock enable logic is needed.

When reset is available, the care-out values must be shifted out first, then reset may be applied to all the scan strings, and thereafter compression, using the technique described above, may be employed based on a set of reset scan strings. The resulting order of the compressed tests may be changed as needed, because each test is independent of the prior tests.

Notwithstanding the embodiments and methods above, it is contemplated that additional exclusive-or gates may be inserted to allow for more than one user-selected tap point in addition to those on non-segment break locations. It is also contemplated that the present embodiment of the invention may be used with any or all of the existing scan based methods and test techniques, including other forms of scan test compression, built-in self-test (BIST), hierarchical scan structures, and any other traditional scan techniques either referred to herein, and other patents or papers readily available to the industry. In all such cases it is expected that the test time and data would be reduced, by the addition of these techniques.

It is further contemplated that the techniques in the embodiments described herein are not limited to any specific number or length of scan string. As such it is further contemplated that the above techniques may be used in part or in whole depending on the configuration scan logic they are applied to. It is further contemplated that equivalent functionality may be obtained by using different but logically equivalent types of structures, and that the methods described herein can be suitably modified by one well versed in the state of the art, to obtain similar results.

I claim:

1. A variable scan flip-flop comprising:
   a multiplicity of external inputs,
   a multiplicity of external outputs,
   a scan flip-flop,
   an inverter, and
   a 2:1 multiplexer;
   wherein said 2:1 multiplexer is connected to form an exclusive-or function between a slave latch of said scan flip-flop and one of said external outputs, one of said multiplicity of external inputs being coupled to a control input of said 2:1 multiplexer, said one of said multiplicity of external outputs to be used during a scan operation.

2. A method of constructing a segmented scan string to utilize compressed scan-based test vectors from a scan string comprised of a plurality of traditional scan flip-flops, the method comprising:
   a) determining locations of a multiplicity of segment breaks along said scan string;
   b) replacing each traditional scan flip-flop with a variable scan flip-flop (VSFF), each VSFF including at least two inputs, $S_i$ and I, and at least two outputs, $S_O$ and $T_O$;
   c) for each VSFF at a segment break, connecting the I input of the VSFF to a $data_{13}in$ signal of the scan string, leaving the $S_O$ output of the VSFF unconnected, and connecting the $T_O$ output of the VSFF to the $S_i$ input of a next VSFF of the scan string;
   d) for a firs VSFF in the scan string, connecting both of said inputs, $S_i$ and I, to said $data_{13}in$ sign of said scan string;
   e) for a last VSFF in the scan string, connecting said $T_O$ output of the VSFF to a $data_{13}out$ signal of the scan string; for all other VSFFs of the scan string, connecting each unconnected $T_O$ output of a VSFF to the next unconnected I input of a next VSFF of the scan string;
   f) connecting the remaining unconnected I input of one VSFF to a $T_O$ output of a previous VSFF of the scan string; and
   g) for all other VSFFs in the scan string, connecting the $S_O$ output to the $S_i$ input of a next VSFF of the scan string.

3. A method as in claim 2, wherein a) includes:
   i) selecting an integer N, where a number of said flip-flops in said scan string is not greater than $2^N$;
   ii) assigning a predetermined number to the first of said flip-flops;
   iii) doubling the predetermined number, modulo $2^N$, to obtain a result;
   iv) choosing the greater of the result and the result plus one that is unique with respect to any previously-generated numbers, to obtain a chosen number;
   v) assigning the chosen number to a next one of said flip-flops;
   vi) repeating steps c) through e), using the chosen number as a next predetermined number, until numbers have been assigned to all said flip-flops in said scan string; and
   vii) changing the logic of each flip-flop assigned an odd number.

4. A method as in claim 3, wherein said predetermined number is zero.

5. A method as in claim 3, wherein said predetermined number is one.

6. A method for segmenting a scan string of flip-flops, the method comprising:
   a) selecting an integer N, where a number of said flip-flops in said scan string is not greater than $2^N$;
   b) assigning a predetermined number to a first one of said flip-flops;
   c) doubling the predetermined number, modulo $2^N$, to obtain a result;
   d) choosing the greater of the result and the result plus one that is unique with respect to any previously-generated numbers, to obtain a chosen number;
   e) assigning the chosen number to a next one of said flip-flops;
   f) repeating steps c) through e), using the chosen number as a next predetermined number, until numbers have been assigned to all said flip-flops in said scan string; and
   g) changing the logic of each flip-flop assigned an odd number.

7. A method for segmenting a scan string as in claim 6, wherein said predetermined number is zero.

8. A method for segmenting a scan string as in claim 6, wherein said predetermined number is one.

* * * * *

UNITED STATES PATENT AND TRADEMARK OFFICE
CERTIFICATE OF CORRECTION

| | | |
|---|---|---|
| PATENT NO. | : 7,412,636 B2 | |
| APPLICATION NO. | : 11/208883 | |
| DATED | : August 12, 2008 | |
| INVENTOR(S) | : Laurence H. Cooke | |

It is certified that error appears in the above-identified patent and that said Letters Patent is hereby corrected as shown below:

Column 7, claim 2, line 45, item d) reads "for a firs VSFF in the scan string, connecting both of said inputs, $S_i$ and I, to said data$_{13}$in sign of said scan string;", it should read -- for a first VSFF in the scan string, connecting both of said inputs, $S_i$ and I, to said data_in signal of said scan string; --.

Column 7, claim 2, line 47, item e) reads "for a last VSFF in the scan string, connecting said $T_o$ output of the VSFF to a data$_{13}$out signal of the scan string; for all other VSFFs of the scan string, connecting each unconnected $T_o$ output of a VSFF to the next unconnected I input of a next VSFF of the scan string;", it should read -- for a last VSFF in the scan string, connecting said $T_o$ output of the VSFF to a data_out signal of the scan string; for all other VSFFs of the scan string, connecting each unconnected $T_o$ output of a VSFF to the next unconnected I input of a next VSFF of the scan string; --.

UNITED STATES PATENT AND TRADEMARK OFFICE
CERTIFICATE OF CORRECTION

PATENT NO. : 7,412,636 B2
APPLICATION NO. : 11/208883
DATED : August 12, 2008
INVENTOR(S) : Laurence H. Cooke It is certified that error appears in the above-identified patent and that said Letters Patent is hereby corrected as shown below:

Column 8, claim 3, line 18, item vi) reads "repeating steps c) through e), using the chosen number as a next predetermined number, until numbers have been assigned to all said flip-flops in said scan string; and", it should read -- repeating steps iii) through v), using the chosen number as a next predetermined number, until numbers have been assigned to all said flip-flops in said scan string; and --.

Signed and Sealed this

Twenty-first Day of October, 2008

JON W. DUDAS
*Director of the United States Patent and Trademark Office*